United States Patent [19]
Schneider et al.

[11] Patent Number: 6,130,466
[45] Date of Patent: Oct. 10, 2000

[54] SEMICONDUCTOR HETEROSTRUCTURE RADIATION DETECTOR HAVING TWO SPECTRAL SENSITIVITY RANGES

[75] Inventors: Harald Schneider, Gundelfingen; Clemens Schoenbein, Freiburg, both of Germany

[73] Assignee: Fraunhofer Gesellschaft zur Foerderung der angewandten Forschung e.V., Munich, Germany

[21] Appl. No.: 09/061,282

[22] Filed: Apr. 17, 1998

Related U.S. Application Data

[63] Continuation of application No. PCT/DE96/01983, Oct. 16, 1996.

[30] Foreign Application Priority Data

Oct. 17, 1995 [DE] Germany .......................... 195 38 650

[51] Int. Cl.[7] ..................... H01L 31/0304; H01L 31/078; H01L 31/109
[52] U.S. Cl. ........................... 257/440; 257/21; 257/185; 257/189; 257/441; 257/458
[58] Field of Search ............................. 257/21, 185, 189, 257/440, 441, 458

[56] References Cited

U.S. PATENT DOCUMENTS

| | | | |
|---|---|---|---|
| 5,023,685 | 6/1991 | Bethea | ....................................... 257/21 |
| 5,329,136 | 7/1994 | Goosen | ..................................... 257/184 |
| 5,506,418 | 4/1996 | Bois et al. | ................................. 257/21 |

OTHER PUBLICATIONS

Schneider et al *Appl. Phys. Lett.* 68(13) "Voltage–Tunable . . . Structure", Mar. 25, 1996.

*Primary Examiner*—Jerome Jackson, Jr.
*Attorney, Agent, or Firm*—Evenson, McKeown, Edwards & Lenahan, P.L.L.C.

[57] ABSTRACT

A semiconductor heterostructure radiation detector has two adjacent semiconductor layer regions sensitive in different spectral ranges, in which photons having different energies respectively can be absorbed, optically exciting charge carriers present therein. A photo current can be generated in the respective semiconductor layer regions in response to an external electric voltage applied via electrodes provided at the semiconductor heterostructure. One of the semiconductor regions is a photodiode, while the other is a quantum well intersubband photodetector.

22 Claims, 3 Drawing Sheets

SEMICONDUCTOR HETEROSTRUCTURE RADIATION DETECTOR HAVING TWO SPECTRAL SENSITIVITY RANGES

This application is a continuation of International of PCT application number PCT/DE 96/01983 filed Oct. 16, 1996 which claims priority of German patent document 195 38 650.7, filed Oct. 17, 1995 the disclosures of which are expressly incorporated by reference herein.

BACKGROUND AND SUMMARY OF THE INVENTION

The present invention relates to a semiconductor heterostructure radiation detector having two spectral sensitivity ranges provided by means of adjacent semiconductor layer regions in which photons having different energies can be absorbed. The photons optically excite charge carriers present in the semiconductor layer regions in such a manner that a photo current can be generated in response to an external electric voltage applied via electrodes provided at the semiconductor layer structure.

In the field of semiconductor radiation detectors, photodiodes are known with conventional p-i-n junctions as well as so-called quantum well intersubband photodetectors (QWIP), whose spectral sensitivity properties can be set according to the selection of material layer systems, layer thickness parameters and the selection of n-doping or p-doping. Conventional photodiodes possess spectral sensitivity in the visible to the near-infrared spectral range. Depending on the selection of material, they can also detect wavelengths in the $\mu$m range. So-called quantum well intersubband photodetectors actually have spectral sensitivity ranges in the long wave spectral range, preferably in the range between the 3 and 20 $\mu$m range, which can be set by the choice of material and layer thickness parameters.

In addition to performance enhancement and optimization of individual radiation detectors, combinations of radiation detectors, with which electromagnetic radiation of different wavelengths can be detected, are also being examined. For example, so-called two-color detectors are employed in thermography and for the optical discrimination of certain objects within the field detected by the radiation detector.

The article by A. Köck et al.: "Double Wavelength Selective GaAs/AlGaAs Infrared Detector Device", Appl. Phys. Lett. 60, 2011 (1992) proposes combining two QWIP semiconductor structures having different detection wavelengths. The 2-step QWIP system introduced in this article comprises alternating sequences of GaAs/AlGaAs layers.

Quantum well structures differing in the dimensions of the barrier height or the band gap, as well as well-width or layer thickness of the quantum well structure, are employed for setting different spectral sensitivity. The QWIP structures conditioned for detecting different wavelengths, however, are separated by an additional doped contact layer. Although the physical separation attained in this manner has the advantage that both QWIP structures can be separately optimized to their respective operating wavelength, this arrangement has the drawback that, due to the separation, at least one additional electrode is required for voltage supply.

Therefore, for rationalization purposes, an attempt has been made to operate the detector structure described in the aforementioned publications with a not connected, additional electrode. (See K. L. Tsai et al. "Two-Color Infrared Photodetector Using GaAs/AlGaAs and Strained InGaAs/AlGaAs Multiquantum Wells", Appl. Phys. Letter 62, 3704, (1993).) Operation of detector structures of this type has revealed that the relative sensitivity for the two operating wavelengths can be tuned by applying a suitable voltage. However, there is the disadvantage that the individual series-connected detectors influence each other electrically. Depending on the application of external voltage, the photosensitivity of one of the two combined detectors can be raised, with the sensitivity of the other detector being lowered. The overall noise behavior of this detector combination is also determined by the respective detector element not participating in photodetection. Consequently the signal-to-noise ratio of this detection structure is relatively poor.

Furthermore, a two-color detector based on a single QWIP structure having two possible intersubband transitions with wavelengths of 5 $\mu$m and 10 $\mu$m is suggested by K. Kheng et al.: "Two-color GaAs/(AlGa)As Quantum Well Infrared Detector With Voltage-tunable Spectral Sensitivity at 3–5 and 8–12 $\mu$m", Appl. Phys. Letter 61, 666(1992). The selection of operating wavelengths is made possible by the fact that the 5 $\mu$m transitions demonstrates photovoltaic and the 10 $\mu$m transitions photoconductive behavior. In this case as well, the principal disadvantage is that the noise behavior is also determined at short operating wavelengths by the noise associated with long wavelength detection.

Finally, electrically tunable two-color detectors formed by combining two back-to-back p-i-n photodiodes are known. (See M. P. Reine et al.: "Independently Accessed Back-To-Back HgCdTe Photodiodes: A New Dual-Band Infrared Detector", J. Electronic Mater. 24, 669 (1995).)

The object of the present invention is to provide a semiconductor heterostructure radiation detector which overcomes the deficiencies described above.

This and other objects and advantages are achieved by the radiation detector according to the invention, which has two adjacent semiconductor layer regions sensitive in different spectral ranges which can absorb photons having different energies. These photons optically excite the charge carriers present in the semiconductor layer regions in such a manner that a photo current in the respective semiconductor layer region can be generated in response to an external electric voltage applied via electrodes provided at the semiconductor heterostructure, and spectral sensitivity ranges of both semiconductor layer structures can be set separately without lastingly influencing the overall noise behavior of the two-color detector. In particular, the noise behavior of the two-color detector should be dominated by the noise of the active individual detector. Moreover, it should be possible to set and optimize the spectral sensitivity ranges of both semiconductor layer detectors largely independently of each other.

In the radiation detector according to the present invention, the two adjacent semiconductor layer regions differing in their spectral sensitivity ranges are provided by a combination of a photodiode and a quantum well intersubband photodetector. By combining a photodiode with a QWIP structure according to the present invention, in contrast to previous attempts at realizing electrically tunable two-color detectors, the noise behavior of the invented two-color detector can be determined by the noise of the respective active individual detector.

In a preferred embodiment of the invention, the individual detectors of different construction are applied onto a base substrate. The layer sequence of a p-i-n photodiode is precipitated epitaxially, preferably by molecular beam epitaxy, on top of which the layer sequence of a quantum well intersubband photodetector is applied in immediate succession. Moreover, at least two electrodes are provided, one of which is contacted with the photodiode contact layer opposite the QWIP structure and the other electrode with the top covering layer of the QWIP structure.

Upon application of an external electric voltage to the electrodes so that the p-i-n photodiode is operated in forward direction, the spectral sensitivity of the invented two-color detector is determined by the semiconductor layer region of the QWIP structure. This is so because the photodiode, which is operated in forward direction, possesses a negligible differential intrinsic resistance. Consequently, it does not lastingly influence the sensitivity of the active QWIP structure.

On the other hand, if the external voltage is applied in such a manner that the photodiode is operated in the reverse direction, the sensitivity of the entire two-color detector is determined solely by the photodiode, because the photodiode possesses a high dark resistance, so that the differential intrinsic resistance of the QWIP structure can be neglected.

Other objects, advantages and novel features of the present invention will become apparent from the following detailed description of the invention when considered in conjunction with the accompanying drawings.

DETAILED DESCRIPTION OF THE DRAWINGS

Figure 1:
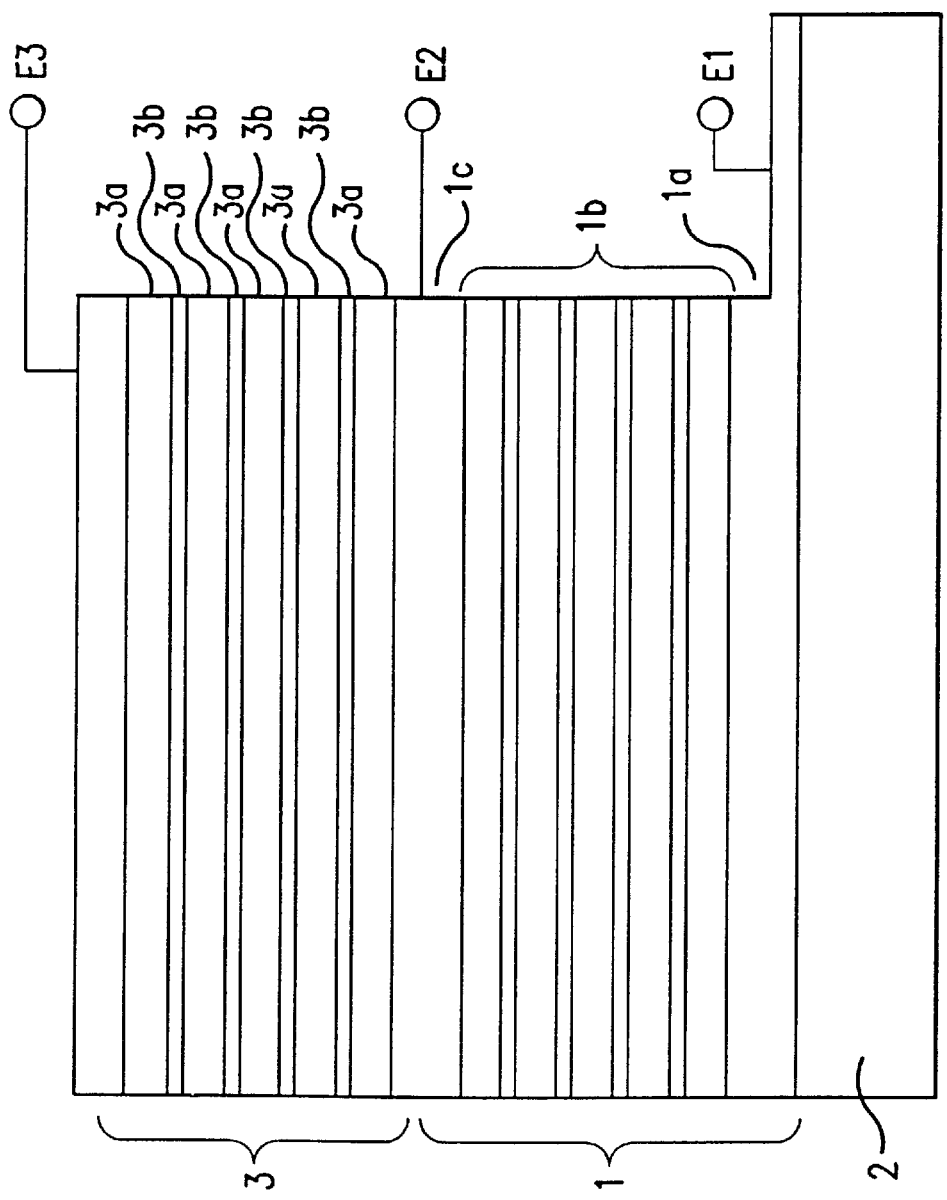
FIG. 1 is a schematic depiction of the layer structure of a radiation detector according to the invention.

In FIG. 1, a layer sequence of a p-i-n photodiode 1 is deposited on a substrate layer 2 with the layer sequence of an intersubband photodetector 3 applied immediately on top of the p-i-n photodiode structure. A p-doped GaAs layer (1a), which serves as the p-region of the p-i-n photodiode, is applied to a base substrate layer (2) composed of GaAs. Moreover, all further layer sequences are applied on top of each other with the aid of molecular beam epitaxy. The intrinsic (i) region (1b) characteristic for a photodiode possesses a multiplicity of thin, alternating InGaAs layers in succession with GaAs layers. An n-doped GaAs layer (1c), which is precipitated onto the so-called pared multiquantum well structure in the i-region, provides the n-region of the p-i-n photodiode. A quantum well intersubband structure (3) having the layer sequence AlGaAs (3a) and GaAs (3b) is applied immediately on top of the n-layer, and an n-doped GaAs layer is employed as the final covering layer of the quantum intersubband structure.

The invented combination of a photodiode and a QWIP structure is provided, according to the preferred embodiment of FIG. 1 as described there, with the electrodes E1, E2 and E3. Electrode E2, which preferably is applied to the n-region of the photodiode, is executed as a floating electrode.

Figure 2:
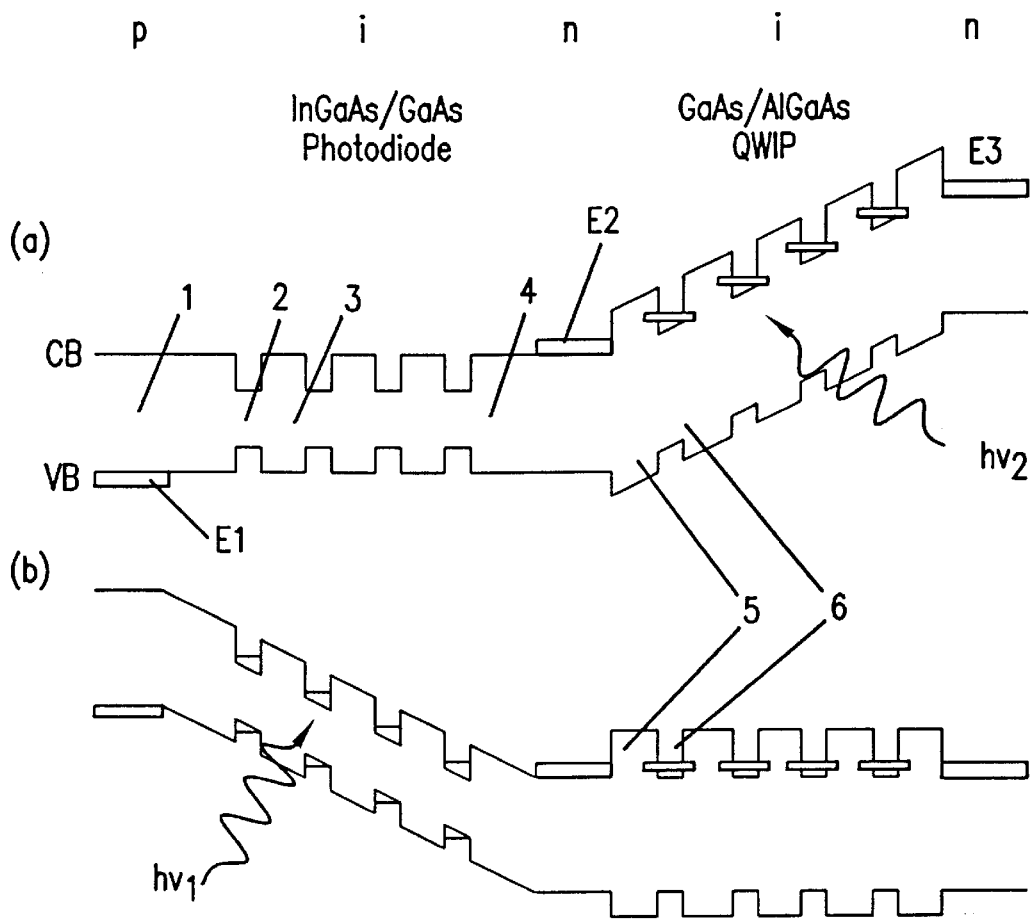
FIGS. 2a and b are band diagrams which depict two different states of operation of the two-color detector according to the invention.

FIG. 2 shows in details a and b, the band diagrams respectively of an advantageous preferred embodiment of the invented two-color detector. The parallel continuous lines represent the valance band (VB) and the conduction band (CB), respectively. The layers with smaller band gaps 20 in the p-i-n photodiode structure correspond to the InGaAs layer regions, whereas the layer regions with larger band gaps contain GaAs. The i-layer designed in this manner serves, in particular, to expand the sensitivity range to wavelengths for which the GaAs substrate is transparent. Regions with a larger band gap 21 in the QWIP structure correspond to the AlGaAs layer (5), whereas the regions with smaller band gaps respectively laying therebetween are composed of n-doped GaAs.

The quantum well structure is dimensioned in such a manner that the charge carriers L located in the potential wells assume quantized states and that the barrier height determined by the large band gap in the AlGaAs layers prevent the charge carriers from tunnelling through from one potential well to the other.

In FIG. 2(a) an external voltage applied via electrodes E1 and E3 causes the photodiode to operate in the forward direction. Under these voltage conditions, the band diagram of the QWIP structure is bent due to the extant external electrical field in such a manner that, due to optical excitation, the electrons located in the lower subbands are excited into upper states (not shown) lying near or above the conduction band edge. Due to the optical excitation, charge carriers of this type can also be partially raised into the continuum i.e., above the conduction band edge energy so that they are immediately drawn off laterally due to the external electrical field and, in this manner, are able to contribute to the photo current.

The operating state of the two-color detector according to FIG. 2a represents a case in which the spectral sensitivity range of the QWIP structure prevails, so that the developing photo current is solely composed of charge carriers emanating as a result of intersubband absorption processes. If however, the external voltage is applied so that the photodiode is biased in the reverse direction, the charge carriers generated inside the i-layer are separated due to the optical absorption by the electric field prevailing within the i-layer and, in this manner, contribute to the photo current.

An essential characteristic of the invented two-color detector is that the noise behavior of the entire detector is determined by that part of the detector in which the photo current is generated. This is due in particular to the fact that the photodiode biased in the block direction has an extremely high dark resistance relative to the differential intrinsic resistance of the QWIP structure, so that the latter can be ignored. Likewise the differential intrinsic resistance of the photodiode, which is biased in the forward direction, has such a low value that the noise portion from this detector region compared to the noise portion of the actively operated QWIP structure can be ignored due to an appropriate material selection.

Preferably the two-color detector, as described in the mentioned example according to FIG. 2 is optimized to two wavelengths so that long wave radiation portions are absorbed by the QWIP structure and the short wavelength portions are absorbed by the p-i-n photodiode.

Figure 3:
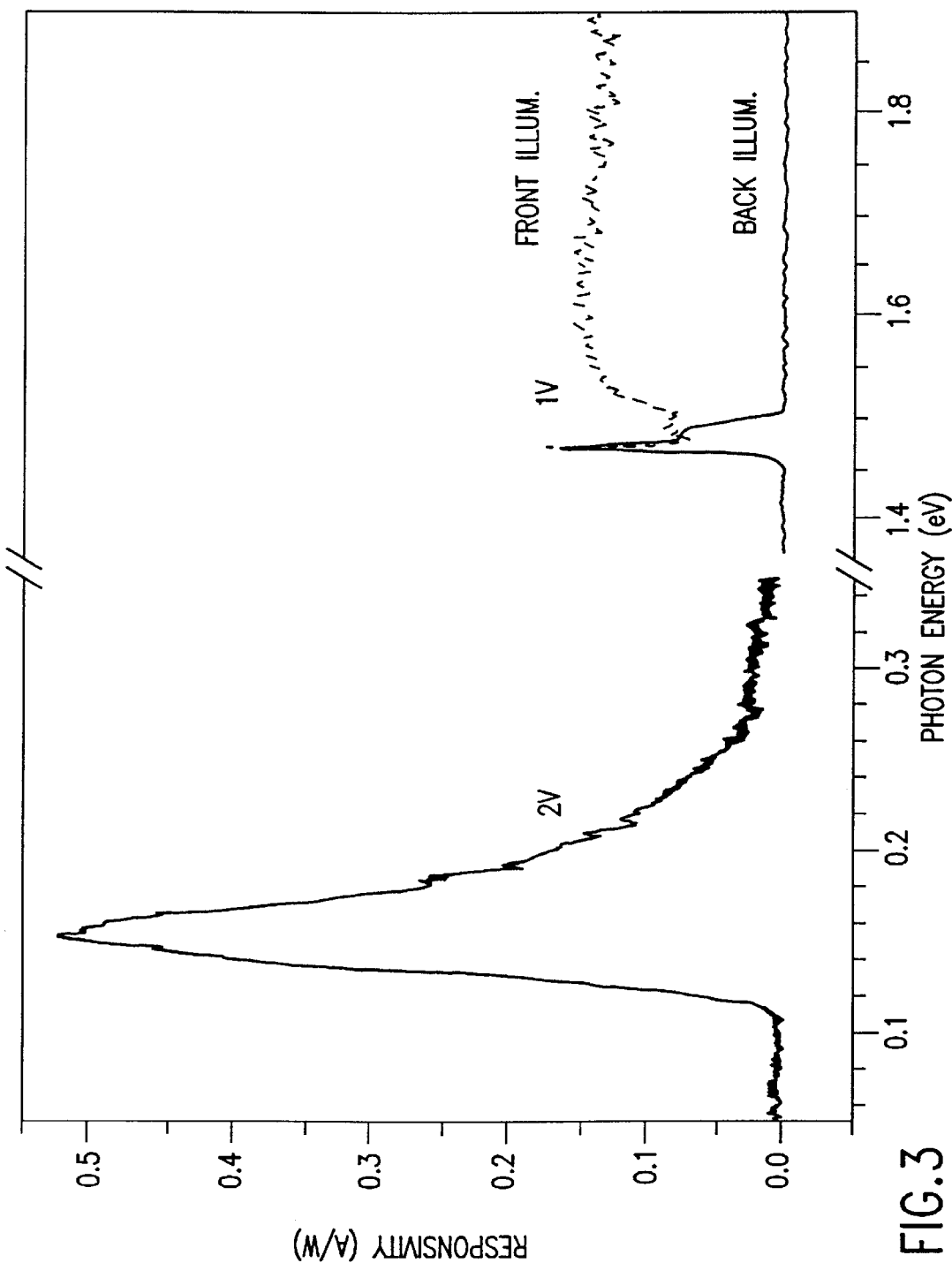
FIG. 3 shows the variation of the detector sensitivity as a function of the applied external voltage.

FIG. 3 is a diagram showing the dependence of the spectral sensitivity of the two-color detector of FIG. 1 on the photon energy, for two different voltage conditions. The spectral sensitivity is shown in amperes per irradiated photon power in watts along the ordinate. The photon energies are plotted on the abscissa.

If the external voltage is 2 volts in the forward direction of the photodiode, the spectral sensitivity of the QWIP structure is 0.5 A/W at a photon energy of 153 meV. If, however, a bias voltage of 1 volt is applied in the block direction of the photodiode, a spectral sensitivity of 0.18 A/W at a photon energy of 1.47 eV. is yielded in the region of the photodiode.

The measured data generated by the invented two-color detector correspond to the respective detector sensitivities of separate known individual detectors. Thus, it can be demonstrated that a combination of a radiation detector composed of a photodiode and a quantum well intersubband photodetector possesses similar detection properties as single individual detectors do.

Furthermore, FIG. 3 shows in the right bottom part of the diagram that by irradiating the two-color detector from the back side (back illum.), i.e., from the side of the base substrate, the sensitivity range breaks off at 1.5 eV, which can be explained by the great absorption of the base substrate. In contrast, the dotted line indicates the spectral sensitivity of the photodiode under forward illumination which lies considerably above the value under backside illumination.

In addition to the aforementioned preferred embodiments of the invented two-color detector, other combinations of materials or doping possibilities are feasible. Thus n-i-p photodiodes can also be employed and can be combined with a correspondingly p-doped quantum well structure. Likewise inverted layer sequences are feasible in which first the QWIP structure and then the layers of the photodiode are precipitated onto the substrate. Additional preferred embodiments are yielded, by way of illustration, when a p-doped quantum well intersubband photodetector, i.e., a QWIP structure having p-doped quantum well layers and a p-conducting contact, are employed.

Moreover, there are alternatives to the above described material system AlGaAs/GaAs/InGaAs. Thus, it is also possible to precipitate onto an InP-substrate, the base substrate, a multilayer sequence composed of InGaAs/InAlAs as the QWIP structure adapted to the lattice constant of the substrate crystal respectively slightly strained. Furthermore, InGaAs can be selected as the photodiode material.

Alternatively, a multilayer sequence composed of GaSb/AlGaSb can be precipitated as the QWIP structure onto a GaSb substrate on top of which InAs or a superlattice composed of GaSb-InAs or composed of AlGaSb/InGaSb can be precipitated as the photodiode layer.

By using different materials, and by a suitable selection of layer parameters and types of doping, two-color detectors can be conditioned as desired using the invented combination of a photodiode and a QWIP structure. Thus, the detector regions can be separately optimized for different spectral sensitivity ranges respectively.

A diffraction grating applied onto or under the detector structure usually employed in connection with QWIP detectors is utilized as a further advantageous improvement of the invented semiconductor heterostructure radiation detector. The advantage of a grating of this type is that, due to the polarization selection principles for intersubband transitions, the incident light must have a component of the electric field vector along the growth direction of the semiconductor lattice. This means that the propagation direction of the light within the detector structure should occur perpendicular to respectively diagonal to the growth direction. In order to meet this demand better, the part of the radiation falling onto the structure or the part of the radiation reflected opposite the illuminated side of the detector, which lies in the spectral sensitivity range of the quantum well intersubband photodetector, are diffracted diagonal to the incidence direction.

The invented two-color detectors can be operated in single operation as well as in an array arrangement. Typical lateral dimensions of a single detector are $(10–1000\ \mu m)^2$ with a typical overall layer thickness of a few $\mu m$. In particular, two-color detectors of this type are employed in so-called focal plane array camera systems which are, by way of illustration, used in thermography.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A semiconductor heterostructure radiation detector having first and second adjacent semiconductor layer regions which absorb photons having different energies respectively and which are sensitive in different spectral ranges, absorbed photons optically exciting charge carriers present in said semiconductor layer regions in such a manner that a photo current can be generated in said respective semiconductor layer regions in response to an external electric voltage applied via electrodes provided at the semiconductor heterostructure, wherein:

said first semiconductor layer region is a photodiode; and said second semiconductor layer region is a quantum well intersubband photodetector.

2. A semiconductor radiation detector according to claim 1, wherein:

said quantum well intersubband photodetector is n-doped;

said photodiode has an n-doped region which is adjacent to said quantum well intersubband photodetector; and for applying an external voltage to said radiation detector, a first electrode is applied to the p-doped region of said photodiode and a second electrode is applied to said quantum well intersubband photodetector.

3. A semiconductor radiation detector according to claim 1, wherein:

said quantum well intersubband photodetector is p-doped;

said photodiode has a p-doped region which is adjacent to said quantum well intersubband photodetector; and for applying an external voltage to said radiation detector, a first electrode is applied to the n-doped region of said photodiode and a second electrode is applied to said quantum well intersubband photodetector.

4. A semiconductor radiation detector according to claim 1, wherein a layer sequence of a photodiode is precipitated onto a base substrate, and the layer sequence of a quantum well intersubband photodetector is applied on the layer sequence of the photodiode.

5. A semiconductor radiation detector according to claim 1, wherein a layer sequence of a quantum well intersubband photodetector is precipitated onto a base substrate, and the layer sequence of a photodiode is applied thereon.

6. A semiconductor radiation detector according to claim 1 wherein by varying the external voltage, the spectral sensitivity ranges of both said semiconductor regions can be selected.

7. A semiconductor radiation detector according to claim 1 wherein said photodiode is a p-i-n photodiode.

8. A semiconductor radiation detector according to claim 7, wherein another electrode is provided at the n-region of said p-i-n photodiode.

9. A semiconductor radiation detector according to claim 7 wherein said photodiode is composed of the following layers:

p-layer: p-doped GaAs;

i-layer: InGaAs/GaAs alternating layer sequence;

n-layer: n-doped GaAs; and said quantum well intersubband photodetector is applied immediately onto said n-layer of said photodiode, and has alternating layers of AlGaAs and GaAs respectively.

10. A semiconductor radiation detector according to claim 1 wherein intersubband gaps contributing to photoabsorption are smaller within said quantum well intersubband photodetector than within corresponding band gaps of said photodiode.

11. A semiconductor radiation detector according to claim 1 wherein, with an application of an external voltage to said radiation detector in a forward direction, said photodiode has a differential intrinsic resistance which is negligible in comparison to said quantum well intersubband photodetector.

12. A semiconductor radiation detector according to claim 1 wherein, with an application of an external voltage to said radiation detector in a reverse direction, a dark resistance which is negligible in comparison to differential intrinsic resistance of said quantum well intersubband photodetector.

13. A semiconductor radiation detector according to claim 1 wherein said photodiode has a short wavelength sensitivity, and said quantum well intersubband photodetector a long wavelength sensitivity range.

14. A semiconductor radiation detector according to claim 1 wherein individual layer sequences of said photodiode and said quantum well intersubband photodetector are applied successively epitaxially onto a substrate.

15. A semiconductor radiation detector according to claim 1 wherein said two semiconductor layer regions have the following spectral sensitivity ranges:

visible spectral range or near-infrared and 3–5 $\mu$m or

8–12 $\mu$m or

3–5 $\mu$m and 8–12 $\mu$m.

16. A semiconductor radiation detector according to claim 1 wherein:

said photodiode comprises InGaAs on a InP-substrate; and said quantum well intersubband photodetector comprises alternating layers of InGaAs and InAlAs respectively.

17. A semiconductor radiation detector according to claim 1 wherein on a GaSb substrate, InAs is used as the photodiode material or a GaSb/InAs superlattice or an AlGaSb/InGaSb superlattice can be used and said quantum well intersubband photodetector has alternating layers of GaSb and AlGaSb respectively.

18. A semiconductor radiation detector according to claim 1 wherein a diffraction grating is provided on or under said semiconductor heterostructure radiation detector, which diffracts diagonally to the incidence direction the part of the radiation lying in the spectral sensitivity range of said quantum well intersubband photodetector falling onto the structure, or the part of the radiation laying in the spectral sensitivity range of said quantum well intersubband photodetector reflected opposite the illuminated side of said detector.

19. A semiconductor heterostructure radiation detector in which absorbed photons optically excite charge carriers present therein whereby a photo current can be generated in response to an externally applied voltage, said radiation detector comprising:

a first semiconductor layer region which absorbs photons having a first energy level and is sensitive in a first spectral range;

a second semiconductor layer region which is adjacent said first semiconductor region, and which absorbs photons having a second energy level different from said first energy level, and is sensitive to a second spectral range different from said first spectral range; and electrodes for applying voltage to said semiconductor heterostructure; wherein said first semiconductor layer region comprises a photodiode layer structure; and said second semiconductor layer region comprises a quantum well intersubband photodetector layer structure.

20. A semiconductor radiation detector according to claim 19, wherein:

said quantum well intersubband photodetector is n-conductive;

said photodiode has an n-doped region, which is adjacent to said quantum well intersubband photodetector; and in order to apply an external voltage, a first electrode is applied to the p-doped region of said photodiode and a second electrode is applied to said quantum well intersubband photodetector.

21. A semiconductor radiation detector according to claim 19, wherein:

said quantum well intersubband photodetector is p-doped;

said photodiode has a p-doped region which is adjacent to said quantum well intersubband photodetector; and in order to apply an external voltage, a first electrode is applied to the n-doped region of said photodiode and a second electrode is applied to said quantum well intersubband photodetector.

22. A semiconductor heterostructure radiation detector, comprising:

a first semiconductor layer region forming a photodiode;

a second semiconductor layer region forming a quantum well intersubband photodetector in series electrical contact with said first semiconductor layer region; and electrodes for applying a bias voltage across said first and second semiconductor layer regions.

* * * * *